(12) United States Patent
Young

(10) Patent No.: US 6,825,474 B2
(45) Date of Patent: Nov. 30, 2004

(54) DIMENSIONALLY STABLE ION OPTIC COMPONENT AND METHOD OF MANUFACTURING

(75) Inventor: James E. Young, La Honda, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 54 days.

(21) Appl. No.: 10/072,214

(22) Filed: Feb. 7, 2002

(65) Prior Publication Data

US 2003/0155520 A1 Aug. 21, 2003

(51) Int. Cl.⁷ .............................................. H01J 37/147
(52) U.S. Cl. .................................................. 250/396 R
(58) Field of Search .............................. 250/396 R, 287

(56) References Cited

U.S. PATENT DOCUMENTS

| | | | | |
|---|---|---|---|---|
| 4,390,784 A | * | 6/1983 | Browning et al. | 250/287 |
| 5,021,654 A | * | 6/1991 | Campbell et al. | 250/287 |
| 5,286,944 A | * | 2/1994 | Li | 219/69.15 |
| 5,384,461 A | * | 1/1995 | Jullien et al. | 250/292 |
| 6,191,419 B1 | * | 2/2001 | Sinha | 250/294 |
| 6,281,494 B1 | * | 8/2001 | Chutjian et al. | 250/292 |

OTHER PUBLICATIONS

Frazen, "Electrical Ion Guides," Proceedings of the 44th MSMA Conference on Mass Spectometry and Allied Topics, p. 1170 (1996), p. 1170.
Optics of Charged Particles by Hermann Wollnik, Physikalisches Institut; Justus Leigig–Universitat; Glessen, Federal Republic of Germany; 1987 Academic Press, Inc.; pp. 48–88; pp. 253–290.

* cited by examiner

*Primary Examiner*—John R. Lee
*Assistant Examiner*—Phillip A Johnston

(57) ABSTRACT

An ion optic device is dimensionally stable over variations in temperature when constructed with a ceramic or glass-ceramic substrate. A conductive or resistive coating is applied on surfaces of the substrate that are required to be particularly conductive or resistive for the function of the ion optic device.

14 Claims, 3 Drawing Sheets

DIMENSIONALLY STABLE ION OPTIC COMPONENT AND METHOD OF MANUFACTURING

BACKGROUND OF THE INVENTION

1. Technical Field of the Invention

The present invention relates to ion optic devices, and more particularly to manufacturing ion optic devices and components of ion optic devices which are dimensionally stable throughout variations in temperature.

2. Description of Related Art

Scientific instruments such as mass spectrometers, residual gas analyzers, mass filters, ion containment apparatus and particle beam accelerators all use ion optic components to manipulate ion particles. The accuracy of these scientific instruments is dependent, at least in part, on the dimensional precision of the ion optics therein.

For example, a mass filter such as a quadrupole, hexapole or octopole is used to separate ionized particles based on their mass-to-charge ratios. FIG. 1 depicts a generic quadrupole mass filter 100 that includes four parallel metal elongated electrodes 110, separated by ceramic interstitial supports 120. Two opposing electrodes 110 have an applied potential of negative polarity and the other two electrodes 110 have an applied potential of positive polarity. The applied voltages affect the trajectory of ions traveling down the "flight path" centered between the four electrodes. For given voltages, only ions of a certain mass-to-charge ratio pass through the quadrupole filter and all other ions are thrown out of their original path. A mass spectrum is obtained by monitoring the ions passing through the quadrupole filter as the voltages on the electrodes are varied.

The performance of the mass filter is critically dependent on the mechanical accuracy of the individual poles (electrodes) and their relationship to each other. With variations in temperature, the electrodes and interstitial supports change dimensionally and the relative position of the electrodes varies. This affects the accuracy of the mass filter, for example, by varying the intensity of the electrical field in the flight path, which is undesirable. Other ion optic devices, such as an ion mirror, a pulser, an Einsel lense, and others, are also similarly affected by temperature.

In prior art devices, attempts have been made to construct ion optic devices that are dimensionally stable across a given temperature range by fabricating one or more components of these devices from materials having a low thermal expansion coefficient (hereinafter a "thermally stable material"). However, it is difficult to find materials that are both thermally stable and that have other properties necessary for particular components required in an ion optic device. For example, in the quadrupole mass filter example above, the interstitial supports 120 are generally constructed from thermally stable ceramic materials. The electrodes 110 are commonly constructed of metal. Metals generally have a high thermal expansion coefficient, but are necessary in a mass filter because of their conductivity. Thus, some materials are chosen because they are thermally stable and some are chosen because they perform the function required of the component they embody. Ultimately thermal stability of the ion optic device is compromised.

Therefore, there is a need for a method which allows construction of ion optic devices and components thereof which are more dimensionally stable across temperature variations.

SUMMARY OF THE INVENTION

The exemplary embodiments of the present invention encompass a method of fabricating an ion optic device or components thereof which are substantially dimensionally stable over a given range of temperature. The method may include shaping a ceramic material into at least a portion of the ion optic device. At least a portion of the shaped ceramic material is then covered with at least one covering material. A portion of the covering material can be removed. The at least one covering material can be a conductive or a resistive material, such as a metal or semiconductor material. The ceramic material can be a ceramic, a glass, or a glass-ceramic.

A substantially cylindrical bore can be provided in the ceramic material. At least two portions of the covering material on opposing surfaces of the interior of the bore can be removed to create at least two separate, opposing areas of covering material.

A cavity can be provided in the ceramic material. At least one portion of the covering material circumscribing the interior perimeter of the cavity can be removed to create at least two substantially parallel bands of conductivity within the cavity. The cavity can extend through the ceramic material or can have a blind end. A conductive grid can be attached over one end of the cavity. The ceramic material can be separated into a first portion and a second portion and re-joined with a conductive grid therebetween. If the cavity is provided with a blind end, at least a portion of the blind end in the interior of the cavity is covered with the at least one covering material.

The exemplary embodiments of the present invention also encompass a device for manipulating ions in a vacuum. The device includes a ceramic substrate having a cavity therein. A conductive coating is provided on at least a portion of an interior surface of the cavity. The conductive receives an applied voltage to act upon the ions.

BRIEF DESCRIPTION OF THE DRAWINGS

Various objects and advantages of this invention will become apparent and more readily appreciated from the following description of the presently preferred exemplary embodiments and methods, taken in conjunction with the accompanying drawings of which.

DETAILED DESCRIPTION OF THE EXEMPLARY EMBODIMENTS OF THE INVENTION

Figure 1:
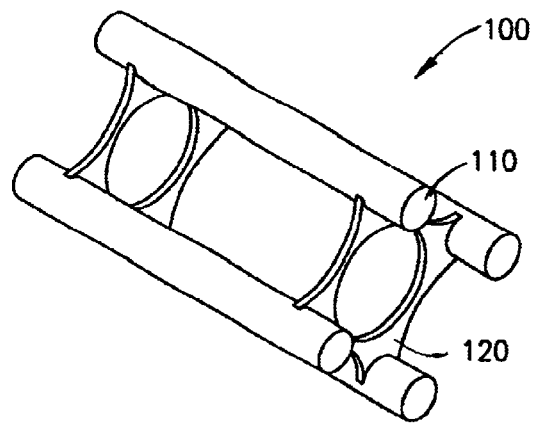
FIG. 1 is a perspective view of a conventional quadrupole.

Before the invention is described in detail, it should be understood that the invention is not limited to the exemplary embodiments or the process steps of the methods described herein. The invention is described herein as applied to the construction of several exemplary ion optic devices primarily for the convenience of discussion. One of ordinary skill in the art will readily appreciate that which is described herein may be applied to many devices and sub-devices that are utilized in technologies involving ion manipulation.

In general terms, the method of the present invention comprises constructing an entire ion optic device or components of an ion optic device from a piece of material which is substantially dimensionally stable throughout the range of temperature which the device or component is likely to encounter. In this method, thermally stable material is first shaped to the desired dimensions of the ion optic device or component. Alternatively, it may be required that the device or component be shaped over a course of several steps, and thus, it is within the scope of this invention that a pre-cursor to the device or component be shaped. For convenience of reference, the device, component or pre-cursor to the device or component is hereinafter referred to as "the part". The shaping can be achieved by virtually any method known in the art, for example, but in no means by limitation, machining or casting the thermally stable material.

The thermally stable material may or may not have the desired conductivity that is required in some aspects of the ion optic device. Therefore, portions of the part which must be conductive are plated or coated with a conductive film, and portions of the part which must be resistive are plated or coated with a resistive film. Conductive and resistive plating or coating can be combined to create regions of particular conductivity or resistivity, depending on the particular configuration desired. The plating or coating can be accomplished by virtually any method known in the art, for example, but in no means by limitation, a vacuum deposition method, and will depend on the type of thermally stable material used and the type or conductive or resistive material deposited.

As it is difficult to accurately plate or coat selective portions of the part, some portions of the plated or coated surfaces may be removed, for example by machining, to create non-conductive areas or to separate regions of plated or coated area. Further, plating or coating a larger area and removing unwanted conductive or resistive material may be more cost effective and provide a more precise part than would be achievable with selective plating or coating. After plating or coating, additional shaping may be performed to achieve the final part.

A preferred thermally stable material for use in an exemplary method of the present invention is a glass-ceramic having a low coefficient of thermal expansion in the range of temperature the device or component is likely to encounter. Glass-ceramics are generally glasses which are devitrified to produce a fine-grained crystalline structure. An example of such a glass-ceramic is sold under the trademark ZERODUR by Schott Glass, Inc. Other suitable materials can include virtually any type of ceramic such as various glasses and other ceramics which have relatively low coefficients of expansion. One skilled in the art will appreciate that many other thermally stable materials having properties desirable for use in the methods herein described can be substituted and that the scope of the present invention is not limited to the use only of glass-ceramics.

For convenience of discussion, the method of the present invention is described herein as applied to the construction of several common ion optic devices.

Figure 2A:
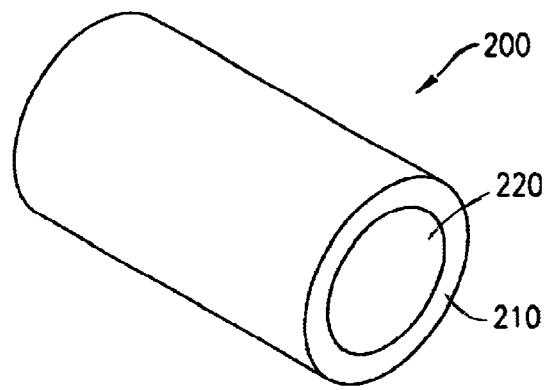
FIGS. 2A–B are perspective views illustrating the construction of a quadruple in accordance with the method of this invention.
Figure 2B:
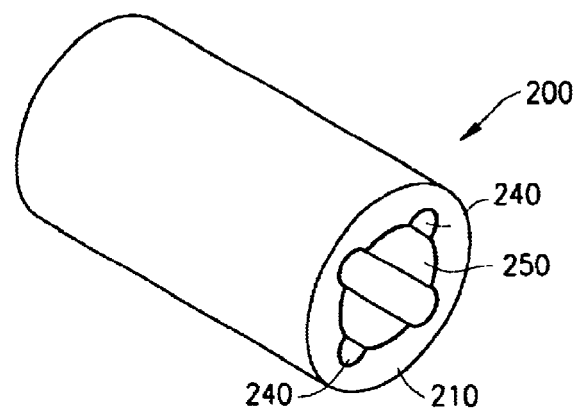

Referring first to FIGS. 2A–B, the method of the present invention is illustrated as applied to the construction of a quadrupole ion guide device 200. In the first step, a thermally stable material is shaped by machining, casting, or other method, to achieve the desired shape and dimensions of a pre-cursor to the quadrupole 200. In the present example, a cavity, or more specifically, a substantially cylindrical bore 220 is machined into a blank of thermally stable material 210.

After the dimensions of the device or the general dimensions of the pre-cursor shape are established, the portions that need to be particularly conductive or resistive are constructed. In the present example, the inner surface of bore 220 will later become the electrodes of the completed quadrupole 200; therefore the inner surface of bore 220 is coated with a conductor material 230, such as a metal like gold or nickel.

After the step of plating or coating the device or pre-cursor shape, additional shaping may be performed to complete the part. In the case of a quadrupole, four conductive electrodes equally spaced in each quadrant of the bore 220 are required. To create the electrodes, four secondary holes 240 as seen in FIG. 2B are bored parallel to the axis of the central bore 220 to isolate four conductive areas 250. The secondary holes 240 are equally spaced in opposed pairs, such that the four resulting conductive areas 250 are equally sized. The four conductive areas 250 form the electrodes of the quadrupole 200. One skilled in the art would appreciate that if more or fewer electrodes 250 are desired, such as to make an octapole or steering plates, or other ion guiding device, the number of secondary holes 240 need only be changed. To wit, if two electrodes are desired, two opposing areas of the conductive or resistive material are removed. If eight electrodes are desired, eight opposing areas of conductive or resistive material are removed. Additional shaping, such as to provide bolt holes, various attachment points, and other details may be performed thereafter to complete the part.

Figure 3A:
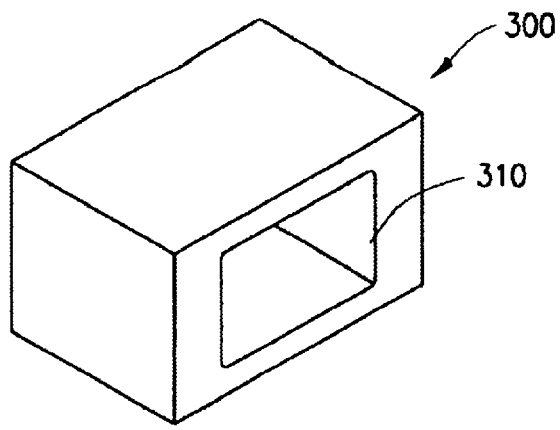
FIGS. 3A–C are perspective views illustrating the construction of an ion mirror or pulser in accordance with the method of this invention.
Figure 3B:
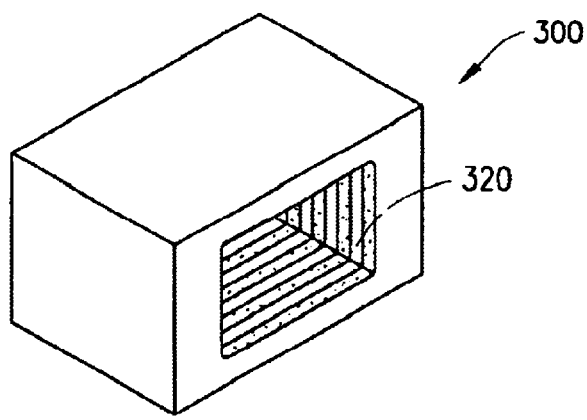
Figure 3C:
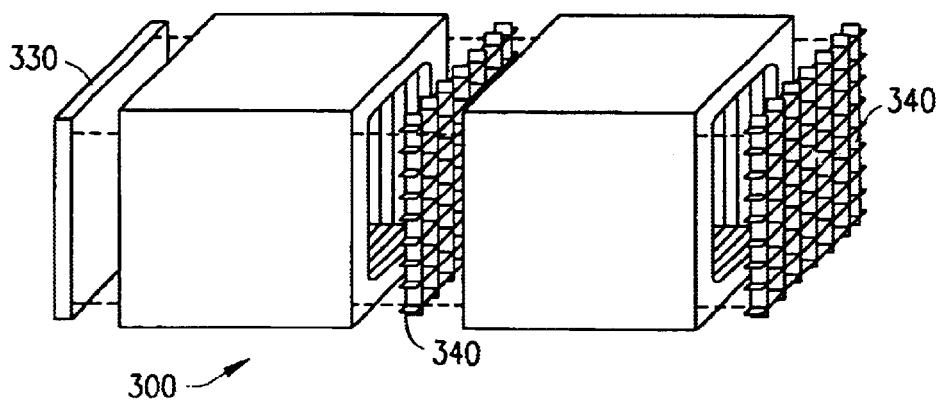

In a second example as seen in FIGS. 3A–C, the method of this invention is illustrated as applied to the construction of an ion mirror or a pulser type device. Though the function of an ion mirror and a pulser is different, the component parts and correspondingly the construction of these devices are similar; therefore the construction of each of these devices is described together. A brief discussion of the operation of each, however, follows.

Figure 4:
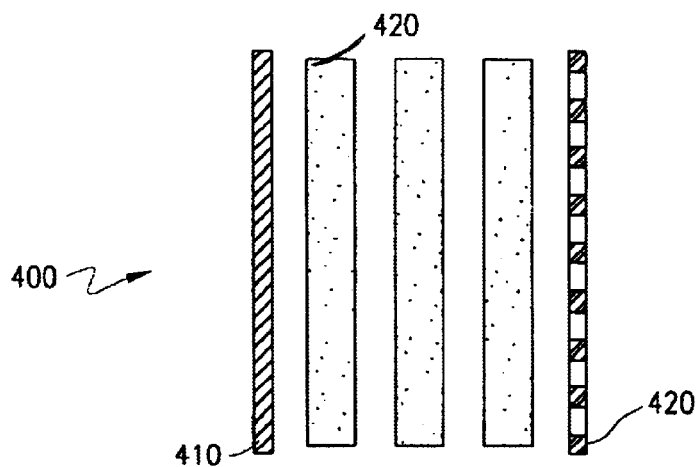
FIG. 4 is a schematic of a generic ion pulser.

Referring briefly to FIG. 4, a pulser 400 in its most simple form comprises a repeller electrode 410 and an extraction grid 420. The repeller electrode 410 and the extraction grid 420 are both constructed of conductive material. Ions are collected between the repeller electrode 410 and the extraction grid 420, with the electrode 410 and the grid 420 at the same potential. The collected ions are then simultaneously accelerated out of the pulser 400 through the grid 420 by rapidly placing the grid 420 at a negative potential relative to the electrode 420. The ions are repelled by the repeller electrode 410 and accelerated through the grid 420 and out of the pulser 400. Additional grids 420 at lower voltages can be supplied to further accelerate the ions. Also, the pulser 400 can further comprise a plurality of conductive bands 430 between the repeller electrode 420 and the extraction grid 410. These bands 430 are provided at stepped voltages to provide a graduated field to accelerate the ions.

Figure 5:
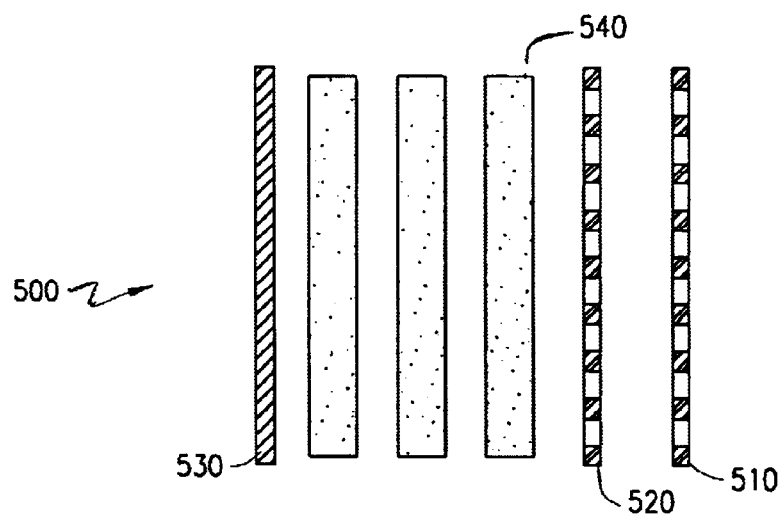
FIG. 5 is a schematic of a generic ion mirror.

Referring briefly to FIG. 5, an ion mirror 500 in its most simple form comprises a first conductive grid 510, a second conductive grid 520, and a conductive repeller electrode 530. The first grid 510 is held at linear potential, the voltage of the flight tube (not shown) entering the ion mirror 500. The second grid 520 is held at a higher voltage to decelerate the ions, and the repeller electrode 530 is held at a voltage slightly above the ion source voltage to repel the ions. Thus, ions traveling into the ion mirror 500 are slowed by the second grid 520 and reverse direction as they approach the repeller electrode 530. The ion mirror 500 can further comprise a plurality of conductive bands 540 between the repeller electrode 530 and the first grid 510. These bands 540 are provided at stepped voltages, like the conductive bands 430 (FIG. 4) described above, to provide a graduated field to accelerate and decelerate the ions.

Referring again to FIGS. 3A–C, the device or part 300 is constructed by first shaping the thermally stable material. In the case of an ion mirror or a pulser, it is desirable to shape the device 300 in a box shape having an interior cavity 310 passing through the part 300. Thereafter, the interior cavity 310 is coated with a conductive material, and grooves 320 are cut into the conductive material to circumscribe the interior perimeter of the cavity. The grooves 320 separate portions of the conductive covering material thus producing the conductive bands 430 (FIG. 4) and 540 (FIG. 5). As seen in FIG. 3C, a conductive repeller electrode 330 can be attached at one end of the part 300 and a conductive grid 340 attached at the other end. If multiple grids 340 are needed, the shape can be parted and the additional grids 340 inserted between sections of the part 300.

Figure 6:
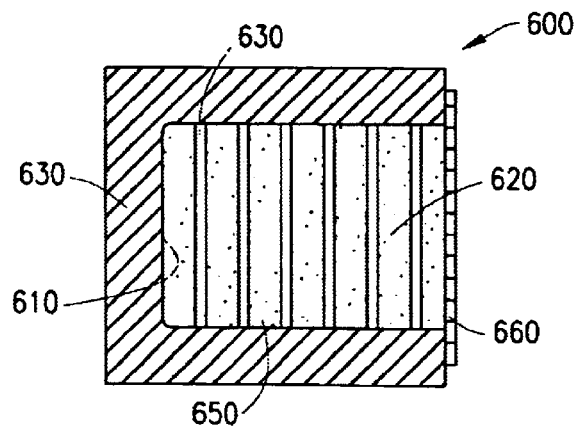
FIG. 6 is a side cross-sectional view of another ion pulser constructed in accordance with the method of this invention.

In an alternate embodiment, shown in FIG. 6, the repeller electrode 610 can be integrated into the part 600. Rather than the internal cavity 620 passing though the part 600 as above, the cavity 620 can have a blind end 630. In other words, the cavity 620 terminates within the part 600. The interior of the cavity 620 is plated or coated in conductive material, and the grooves 640 are cut to form conductive bands 650. The blind end 630 remains plated to form the repeller electrode 610 and one or more conductive grids 660 can be attached as is described above.

The methods of the present invention and devices constructed in accordance with the methods have significant advantages over the prior art. The method enables construction of ion optic devices or components which are more dimensionally stable with temperature than those of the prior art, because materials having a low coefficient of thermal expansion can be used in more of the device or as the entire device. Further, the device can be constructed from a single material to have the same coefficient of thermal expansion throughout, rather than multiple materials which expand and contract at different rates over temperature.

It is to be understood that while the invention has been described above in conjunction with preferred exemplary embodiments, the description and examples are intended to illustrate and not limit the scope of the invention. The method described above and illustrated by the exemplary embodiments can be applied to the construction of many different types of devices which would benefit from thermal stability. Thus, the scope of the invention should only be limited by the following claims.

What is claimed is:

1. A method of fabricating an ion optic device comprising:
shaping a ceramic material such that the ceramic material has a cavity, the ceramic material being at least a portion of the ion optic device;
covering at least a portion of the cavity with at least one material selected from a group consisting of a conductive material and a resistive material and removing a portion of the covering material from said cavity; and
wherein shaping the ceramic material comprises providing the cavity being substantially shaped as a cylindrical bore in the ceramic material; and
wherein removing a portion of the covering material comprises removing at least two portions of the covering material on opposing surfaces of the interior of the bore to create at least two separate opposing areas of covering material.

2. The method of claim 1 wherein the ceramic material is a material selected from the group consisting of ceramic, a glass, and a glass-ceramic.

3. The method of claim 1 wherein the conductive material is metal.

4. An ion optic device for manipulating ions in a vacuum, comprising:
a ceramic substrate having a cavity therein, said cavity is substantially a first cylindrical bore; and
a conductive coating on at least two separate areas on opposing surfaces of the first cylindrical bore, wherein the at least two separate areas of conductive coating are separated by a secondary bore having an axis parallel to the first cylindrical bore.

5. The device of claim 4 wherein the ceramic is a glass-ceramic.

6. An ion optic device for manipulating ions in a vacuum, comprising:
a ceramic substrate having a cavity therein, said cavity having a blind end; and
a conductive coating substantially covering the interior surface of the blind end, said conductive coating further provided in at least two separate bands circumscribing the cavity.

7. A method of fabricating an ion optic device comprising:
shaping a ceramic material such that the ceramic material has a cavity, the ceramic material being at least a portion of the ion optic device;
covering at least a portion of the cavity with at least one material selected from a group consisting of a conductive material and a resistive material; and
removing a portion of the covering material from said cavity;
wherein removing a portion of the covering material comprises removing at least one portion of the covering material circumscribing the interior perimeter of the cavity to create at least two substantially parallel bands of conductivity on an inner surface of the cavity.

8. The method of claim 7 wherein the cavity extends through the ceramic material; and
further comprising the step of attaching a conductive grid over one end of the cavity.

9. The method of claim 7 further comprising separating the ceramic material into a first portion and a second portion; and
joining the first portion and the second portion back together with a conductive grid therebetween.

10. The method of claim 1 wherein shaping the ceramic material comprises providing a blind end in the cavity; and
wherein covering at least a portion of the shaped ceramic material with at least one covering material comprises covering at least a portion of the blind end in the interior of the cavity with a conductive material.

11. The device of claim 6 wherein the cavity has an open end and the device further comprises a conductive grid attached to the ceramic substrate over the open end.

12. The device of claim 6 wherein the ceramic substrate is provided in at least two portions and a conductive grid is provided between the two portions.

13. The device of claim 6 wherein the cavity has an open end and the device further comprises an electrode member attached to the ceramic substrate over the open end.

14. The device of claim 6 wherein the ceramic substrate is a glass-ceramic.

* * * * *